United States Patent
Horiguchi

(10) Patent No.: US 10,476,496 B2
(45) Date of Patent: Nov. 12, 2019

(54) DRIVE CIRCUIT AND POWER MODULE INCLUDING THE SAME

(71) Applicant: Mitsubishi Electric Corporation, Chiyoda-ku (JP)

(72) Inventor: Takeshi Horiguchi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/098,485

(22) PCT Filed: Jun. 21, 2017

(86) PCT No.: PCT/JP2017/022791
§ 371 (c)(1),
(2) Date: Nov. 2, 2018

(87) PCT Pub. No.: WO2018/008398
PCT Pub. Date: Jan. 11, 2018

(65) Prior Publication Data
US 2019/0158083 A1 May 23, 2019

(30) Foreign Application Priority Data
Jul. 4, 2016 (JP) .................................. 2016-132596

(51) Int. Cl.
*H03K 17/16* (2006.01)
(52) U.S. Cl.
CPC .................................. *H03K 17/165* (2013.01)
(58) Field of Classification Search
CPC .................................................... H03K 17/165

USPC .... 327/108–112, 427, 434, 437; 326/82, 83, 326/87
See application file for complete search history.

(56) References Cited

U.S. PATENT DOCUMENTS

2007/0200613 A1* 8/2007 Ishikawa ............ H03K 17/0406
327/427
2013/0214748 A1 8/2013 Uota et al.

FOREIGN PATENT DOCUMENTS

| JP | 2008-22451 A | 1/2008 |
| JP | 2008-66929 A | 3/2008 |
| JP | 2009-225506 A | 10/2009 |
| JP | 2013-168905 A | 8/2013 |

OTHER PUBLICATIONS

International Search Report dated Sep. 12, 2017 in PCT/JP2017/022791 filed Jun. 21, 2017.

* cited by examiner

*Primary Examiner* — Tomi Skibinski
(74) *Attorney, Agent, or Firm* — Oblon, McClelland, Maier & Neustadt, L.L.P.

(57) ABSTRACT

A drive circuit turns on an NPN transistor and a transistor in response to a turn-on command in a control signal to supply a positive current to a gate of a power transistor, and turns off the transistor after lapse of a certain time period to lower gate driving capability. The drive circuit turns on a PNP transistor and a transistor in response to a turn-off command in the control signal to supply a negative current to the gate of the power transistor, and turns off the transistor after lapse of a certain time period to lower gate driving capability.

15 Claims, 12 Drawing Sheets

DRIVE CIRCUIT AND POWER MODULE INCLUDING THE SAME

TECHNICAL FIELD

This invention relates to a drive circuit and a power module including the same and particularly to a drive circuit configured to drive a power transistor and a power module including the same.

BACKGROUND ART

PTL 1 discloses a drive circuit configured to drive a power transistor, in particular, a drive circuit involved with noise reduction. This drive circuit detects a current which flows into a gate terminal of a power transistor at the time of application of a voltage to a gate of the power transistor through a gate resistor to turn on the power transistor, and increases a resistance value of the gate resistor when the detection value changes from increase to decrease. A switching speed of the power transistor is thus lowered to suppress generation of conductive and/or radiative noise.

CITATION LIST

Patent Literature

PTL 1: Japanese Patent Laying-Open No. 2008-022451

SUMMARY OF INVENTION

Technical Problem

According to PTL 1, however, the timing of change in behavior of gate current from increase to decrease should be detected with high accuracy. When accuracy in detection of a gate current is insufficient, the timing of increase in resistance value of the gate resistor is not set to desired timing and conductive and/or radiative noise might not be suppressed.

Therefore, a primary object of this invention is to provide a drive circuit capable of readily suppressing generation of conductive and/or radiative noise and a power module including the same.

Solution to Problem

A drive circuit according to this invention is a drive circuit configured to drive a power transistor in response to a control signal, and the drive circuit includes a control circuit configured to lower gate driving capability in response to lapse of a first predetermined time period since a turn-on command in the control signal.

Advantageous Effects of Invention

The drive circuit according to this invention lowers gate driving capability in response to lapse of a first predetermined time period since a turn-on command in a control signal. Therefore, a switching speed of a power transistor can readily be lowered and generation of conductive and/or radiative noise can readily be suppressed.

DESCRIPTION OF EMBODIMENTS

First Embodiment

Figure 1:
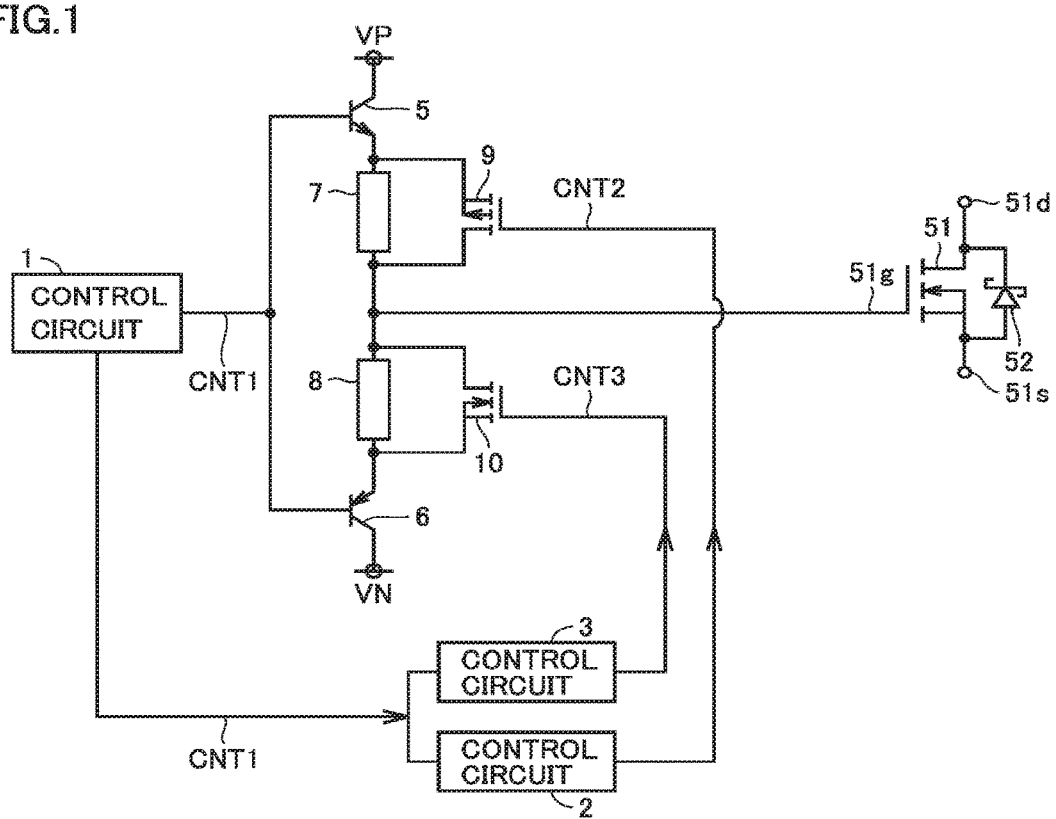
FIG. 1 shows a circuit block diagram showing a configuration of a drive circuit according to a first embodiment of this invention.

FIG. 1 shows a circuit block diagram showing a configuration of a drive circuit according to a first embodiment of this invention. In FIG. 1, this drive circuit is a circuit configured to drive a power transistor 51, and includes control circuits 1 to 3, an NPN transistor 5, a PNP transistor 6, an on-gate resistor 7, an off-gate resistor 8, a P-channel MOS transistor 9, and an N-channel MOS transistor 10.

Power transistor 51 may be a metal oxide semiconductor field effect transistor (MOSFET) or an insulated gate bipolar transistor (IGBT). FIG. 1 shows an example in which power transistor 51 is a MOSFET. Power transistor 51 is included in a power converter. Power transistor 51 includes a gate 51g, a source (a first electrode) 51s, and a drain (a second electrode) 51d. A diode 52 is connected in antiparallel to power transistor 51. Diode 52 is used as a freewheeling diode.

Control circuit 1 outputs a control signal CNT1. Control circuit 1 is described as setting control signal CNT1 to the "H" level in turning on power transistor 51 and setting control signal CNT1 to the "L" level in turning off power transistor 51.

Control circuit 2 outputs a control signal CNT2 in response to control signal CNT1. Control circuit 2 shifts control signal CNT2 from the "H" level to the "L" level in response to rise of control signal CNT1 from the "L" level to the "H" level, and shifts control signal CNT2 from the "L" level to the "H" level after lapse of a predetermined time period T1. Namely, control signal CNT2 is set to the "L" level only for predetermined time period T1 in response to a turn-on command in control signal CNT1.

Control circuit 3 outputs a control signal CNT3 in response to control signal CNT1. Control circuit 3 shifts control signal CNT3 from the "L" level to the "H" level in response to fall of control signal CNT1 from the "H" level to the "L" level and shifts control signal CNT3 from the "H" level to the "L" level after lapse of a predetermined time period T2. Namely, control signal CNT3 is set to the "H" level only for predetermined time period T2 in response to a turn-off command in control signal CNT1.

Figure 2:
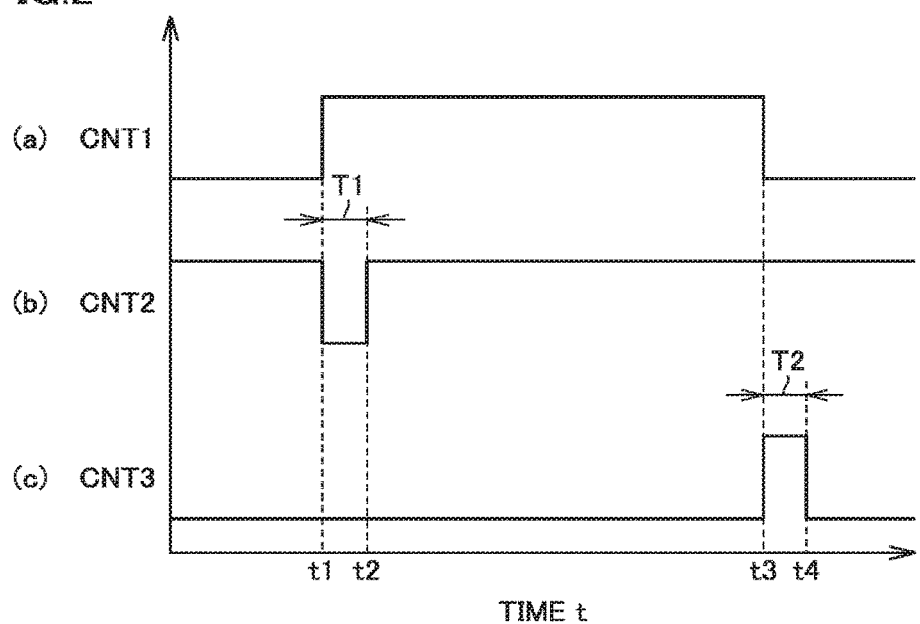
FIG. 2 shows a waveform diagram showing operations by control circuits 1 to 3 shown in FIG. 1.

FIG. 2 (*a*) to (*c*) shows a time chart showing operations by control circuits 1 to 3. FIG. 2 (*a*) shows a waveform of control signal CNT1, FIG. 2 (*b*) shows a waveform of control signal CNT2, and FIG. 2 (*c*) shows a waveform of control signal CNT3. In FIG. 2 (*a*) to (*c*), in the initial state, control signals CNT1 and CNT3 are both set to the "L" level and control signal CNT2 is set to the "H" level.

When control signal CNT1 rises from the "L" level to the "H" level at a certain time t1, control signal CNT2 falls from the "H" level to the "L" level, and control signal CNT2 rises from the "L" level to the "H" level at time t2 after predetermined time period T1.

When control signal CNT1 falls from the "H" level to the "L" level at certain time t3, control signal CNT3 rises from the "L" level to the "H" level, and control signal CNT3 falls from the "H" level to the "L" level at time t4 after predetermined time period T2.

Referring back to FIG. 1, NPN transistor 5 and on-gate resistor 7 are connected in series between gate 51g of power transistor 51 and a line of a positive-electrode-side voltage VP which applies a positive bias voltage between the gate and the source of power transistor 51. NPN transistor 5 is turned on while control signal CNT1 is at the "H" level and turned off while control signal CNT1 is at the "L" level. P-channel MOS transistor 9 is connected in parallel to on-gate resistor 7. P-channel MOS transistor 9 is turned on while control signal CNT2 is at the "L" level and turned off while control signal CNT2 is at the "H" level.

When control signal CNT1 rises from the "L" level to the "H" level, control signal CNT2 falls from the "H" level to the "L" level and NPN transistor 5 and P-channel MOS transistor 9 are both turned on. Thus, a current flows from the line of positive-electrode-side voltage VP through NPN transistor 5 and a parallel connected assembly composed of on-gate resistor 7 and P-channel MOS transistor 9 to gate 51g of power transistor 51 in order to increase the gate-source voltage of power transistor 51 from a negative bias voltage toward a positive bias voltage.

When the gate-source voltage of power transistor 51 exceeds a threshold voltage Vth of power transistor 51, power transistor 51 is turned on. When control signal CNT2 rises from the "L" level to the "H" level after predetermined time period T1 from the turn-on command in control signal CNT1, P-channel MOS transistor 9 is turned off and a resistance value between the line of positive-electrode-side voltage VP and gate 51g of power transistor 51 increases. A switching speed of power transistor 51 is thus lowered and generation of conductive and/or radiative noise is suppressed.

On gate resistor 7 and P-channel MOS transistor 9 implement a first variable resistor. When P-channel MOS transistor 9 is turned on, gate driving capability is improved with decrease in resistance value of the first variable resistor and a switching speed increases. When P-channel MOS transistor 9 is turned off, gate driving capability lowers with increase in resistance value of the first variable resistor and the switching speed lowers.

"Gate driving capability" herein means capability to charge and discharge a gate capacitance of power transistor 51 (a gate-source capacitance and a drain-gate capacitance). When power transistor 51 is turned on, a current which flows from the line of positive-electrode-side voltage VP through NPN transistor 5 and the first variable resistor (on-gate resistor 7 and P-channel MOS transistor 9) into gate 51g of power transistor 51 charges the gate capacitance so that the gate-source voltage of power transistor 51 increases.

When P-channel MOS transistor 9 is turned on, the resistance value of the first variable resistor decreases. Therefore, a current which flows into gate 51g increases, and consequently capability to charge the gate capacitance (gate driving capability) is improved. When P-channel MOS transistor 9 is turned off, the resistance value of the first variable resistor increases. Therefore, a current which flows into gate 51g decreases, and consequently capability to charge the gate capacitance (gate driving capability) is lowered.

Off-gate resistor 8 and PNP transistor 6 are connected in series between gate 51g of power transistor 51 and a line of a negative-electrode-side voltage VN which applies a negative bias voltage between the gate and the source of power transistor 51. PNP transistor 6 is turned on while control signal CNT1 is at the "L" level and turned off when control signal CNT1 is at the "H" level. N-channel MOS transistor 10 is connected in parallel to off-gate resistor 8. N-channel MOS transistor 10 is turned on while control signal CNT3 is at the "H" level and turned off while control signal CNT3 is at the "L" level.

When control signal CNT1 falls from the "H" level to the "L" level, control signal CNT3 rises from the "L" level to the "H" level and PNP transistor 6 and N-channel MOS transistor 10 are both turned on. Thus, a current flows from gate 51g of power transistor 51 through a parallel connected assembly composed of off-gate resistor 8 and N-channel MOS transistor 10 and PNP transistor 6 to the line of negative-electrode-side voltage VN in order to fall the gate-source voltage of power transistor 51 from a positive bias voltage toward a negative bias voltage.

When the gate-source voltage of power transistor 51 falls lower than threshold voltage Vth of power transistor 51, power transistor 51 is turned off. When control signal CNT3 falls from the "H" level to the "L" level after predetermined time period T2 from the turn-off command in control signal CNT1, N-channel MOS transistor 10 is turned off, and a resistance value between gate 51g of power transistor 51 and the line of negative-electrode-side voltage VN increases. A switching speed of power transistor 51 is thus lowered and generation of conductive and/or radiative noise is suppressed.

Off gate resistor 8 and N-channel MOS transistor 10 implement a second variable resistor. When N-channel MOS transistor 10 is turned on, gate driving capability is improved with decrease in resistance value of the second variable resistor and the switching speed increases. When N-channel MOS transistor 10 is turned off, gate driving capability lowers with increase in resistance value of the second variable resistor and the switching speed is lowered.

Thus, when power transistor 51 is turned off, a current flows from gate 51g of power transistor 51 through the second variable resistor (off-gate resistor 8 and N-channel MOS transistor 10) and PNP transistor 6 to the line of negative-electrode-side voltage VN and the gate capacitance is discharged, so that the gate-source voltage of power transistor 51 falls.

When N-channel MOS transistor 10 is turned on, the resistance value of the second variable resistor decreases. Therefore, a current which flows out of gate 51g increases, and consequently capability to discharge the gate capacitance (gate driving capability) is improved. When N-channel MOS transistor 10 is turned off, the resistance value of the second variable resistor increases. Therefore, a current which flows out of gate 51g decreases, and consequently capability to discharge the gate capacitance (gate driving capability) is lowered.

Figure 3:
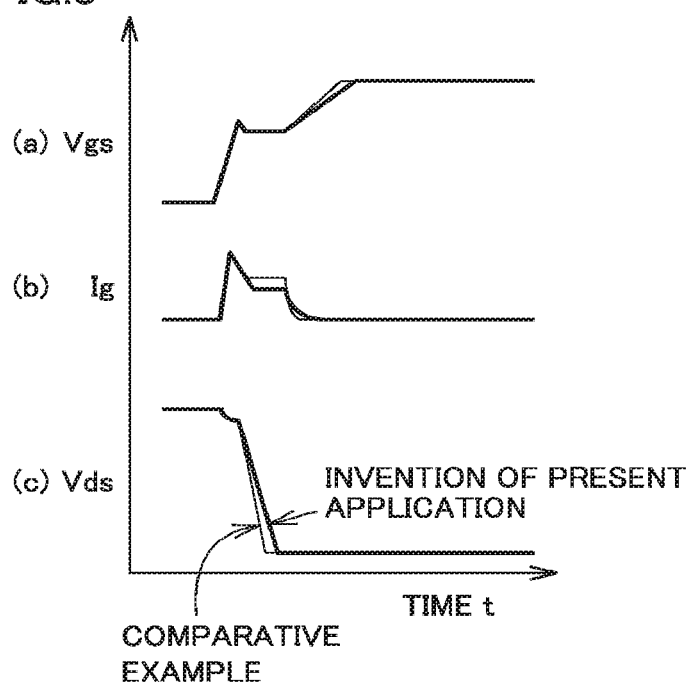
FIG. 3 shows a waveform diagram showing operations by the drive circuit shown in FIG. 1.

FIG. 3 (a) to (c) shows a time chart showing operations by the drive circuit in changing power transistor 51 from an off state to an on state. In particular, FIG. 3 (a) shows a waveform of a gate-source voltage Vgs of power transistor 51, FIG. 3 (b) shows a waveform of a gate current Ig, and FIG. 3 (c) shows a waveform of a drain-source voltage Vds. In FIG. 3 (a) to (c), a bold solid line represents a waveform in the invention of the present application and a thin solid line represents a waveform in a comparative example. In the comparative example, transistors 9 and 10 in FIG. 1 are not mounted in the drive circuit so that gate driving capability is not varied.

In the initial state, power transistor 51 is in the off state, gate-source voltage Vgs is at a negative bias voltage value, and drain-source voltage Vds is at a power supply voltage (a DC link voltage) value. When control signal CNT1 rises from the "L" level to the "H" level at a certain time, a gate-source capacitance of power transistor 51 is charged so that gate-source voltage Vgs increases.

When gate-source voltage Vgs exceeds threshold voltage Vth of power transistor 51, a drain current of power transistor 51 starts to flow. When the drain current reaches a prescribed drain current value, drain-source voltage Vds starts to fall. Since a drain-gate capacitance increases with falling in drain-source voltage Vds, gate current Ig flows through the drain-gate capacitance. Consequently, a period during which gate-source voltage Vgs is substantially constant (a first Miller period) appears. The timing of start of falling in drain-source voltage Vds is the same as the timing of appearance of the Miller period.

Then, time period T1 for which control signal CNT2 is set to the "L" level in response to the turn-on command in control signal CNT1 is set to a time period from the turn-on command in control signal CNT1 until appearance of the Miller period. A switching speed (a rate of falling in drain-source voltage Vds) of power transistor 51 can thus be lowered at the timing of start of falling in drain-source voltage Vds and generation of conductive and/or radiative noise at the time of a turn-on operation can readily be suppressed. In contrast, in the comparative example, when power transistor 51 is turned on, a rate of falling in drain-source voltage Vds is higher than in the invention of the present application and hence a level of generated conductive and/or radiative noise is high.

Figure 4:
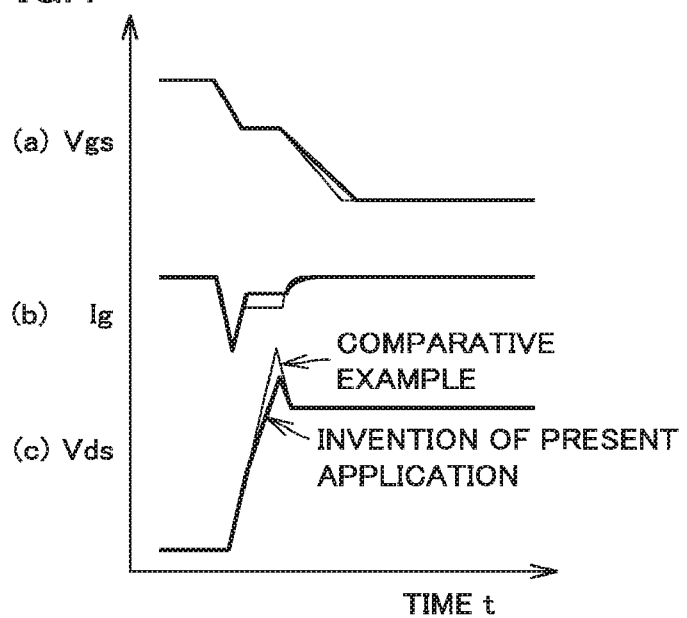
FIG. 4 shows another waveform diagram showing operations by the drive circuit shown in FIG. 1.

FIG. 4 (a) to (c) shows a time chart showing operations by the drive circuit when power transistor 51 is changed from the on state to the off state. In particular, FIG. 4 (a) shows a waveform of gate-source voltage Vgs of power transistor 51, FIG. 4 (b) shows a waveform of gate current Ig, and FIG. 4 (c) shows a waveform of drain-source voltage Vds. In FIG. 4 (a) to (c), a bold solid line represents a waveform in the invention of the present application and a thin solid line represents a waveform in the comparative example.

In the initial state, power transistor 51 is in the on state, gate-source voltage Vgs is at a positive bias voltage value, and drain-source voltage Vds is at an on-state voltage value. When control signal CNT1 falls from the "H" level to the "L" level at a certain time, a gate-source capacitance of power transistor 51 is discharged so that gate-source voltage Vgs falls.

Drain-source voltage Vds gradually increases and a drain-gate capacitance decreases with falling in gate-source voltage Vgs. During a period for which the drain-gate capacitance is discharged with increase in drain-source voltage Vds, gate-source voltage Vgs is substantially constant. This period is the Miller period in turn-off (a second Miller period). When the Miller period ends and drain-source voltage Vds reaches the power supply voltage (the DC link voltage), a drain current which flows through power transistor 51 starts to decrease.

Then, time period T2 for which control signal CNT3 is set to the "H" level in response to a turn-off command in control signal CNT1 is set to a time period from the turn-off command in control signal CNT1 until appearance of the second Miller period. A switching speed of power transistor 51 (a rate of increase in drain-source voltage Vds) can thus be lowered at the timing of rapid increase in drain-source voltage Vds and generation of conductive and/or radiative noise at the time of a turn-off operation can readily be suppressed. Since the drain current decreases at the time when drain-source voltage Vds reaches the power supply voltage (the DC link voltage), the switching speed has already been low and a surge voltage can be suppressed. In contrast, in the comparative example, when power transistor 51 is turned off, the rate of increase in drain-source voltage Vds is higher than in the invention of the present application and hence a level of generated conductive and/or radiative noise is high.

As set forth above, in the first embodiment, a speed of turn-on of power transistor 51 can readily be lowered at the timing of start of falling in drain-source voltage Vds, and generation of conductive and/or radiative noise at the time of the turn-on operation can readily be suppressed.

Similarly, a turn-off speed of power transistor 51 can readily be lowered at the timing of rapid increase in drain-source voltage Vds and generation of conductive and/or radiative noise at the time of the turn-off operation can readily be suppressed. Since the switching speed has already been low at the time of decrease in drain current, a surge voltage can be suppressed.

Figure 5:
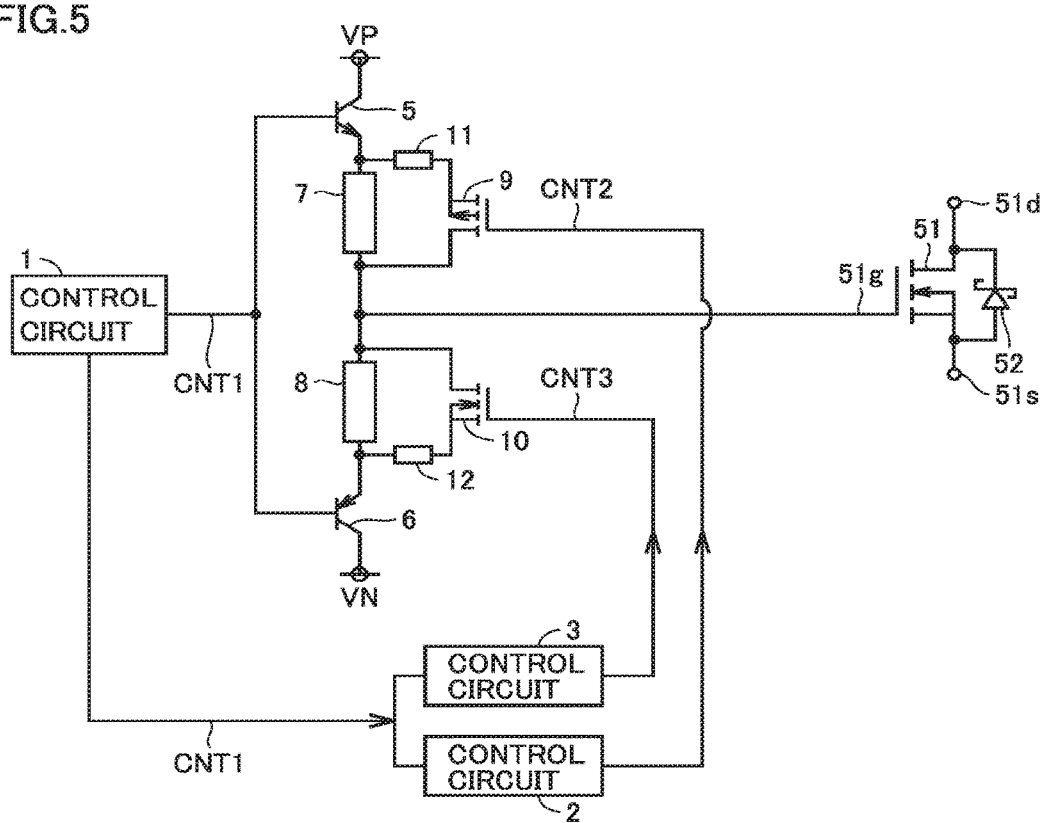
FIG. 5 shows a circuit block diagram showing a modification of the first embodiment.

FIG. 5 shows a circuit block diagram showing a modification of the first embodiment and compared with FIG. 1. Referring to FIG. 5, the modification is different from the drive circuit in FIG. 1 in addition of resistor elements 11 and 12. Resistor element 11 and P-channel MOS transistor 9 connected in series are connected in parallel to on-gate resistor 7. Similarly, resistor element 12 and N-channel MOS transistor 10 connected in series are connected in parallel to off-gate resistor 8.

This modification can provide a similar effect as described in the first embodiment, and in addition, a speed of turn-on and turn-off can be determined based on a combination of on-gate resistor 7 and resistor element 11 or a combination of off-gate resistor 8 and resistor element 12. Since the switching speed directly affects a switching loss, an optimal switching speed can be set in consideration of tradeoff relation between conductive and/or radiative noise and the loss.

A resistor element may further be connected between the drain of P-channel MOS transistor 9 and a negative-voltage-side terminal of on-gate resistor 7 and a resistor element may further be connected between the drain of N-channel MOS transistor 10 and a positive-voltage-side terminal of off-gate resistor 8. Positions of P-channel MOS transistor 9 and resistor element 11 can be interchanged and connected in parallel to on-gate resistor 7. Similarly, positions of N-channel MOS transistor 10 and resistor element 12 can be interchanged and connected in parallel to off-gate resistor 8.

Though a P-channel MOS transistor and an N-channel MOS transistor or a PNP transistor and an NPN transistor are described as semiconductor switching elements, limitation to the MOSFET or the transistor is not intended so long as a semiconductor switching element is applied.

Second Embodiment

Figure 6:
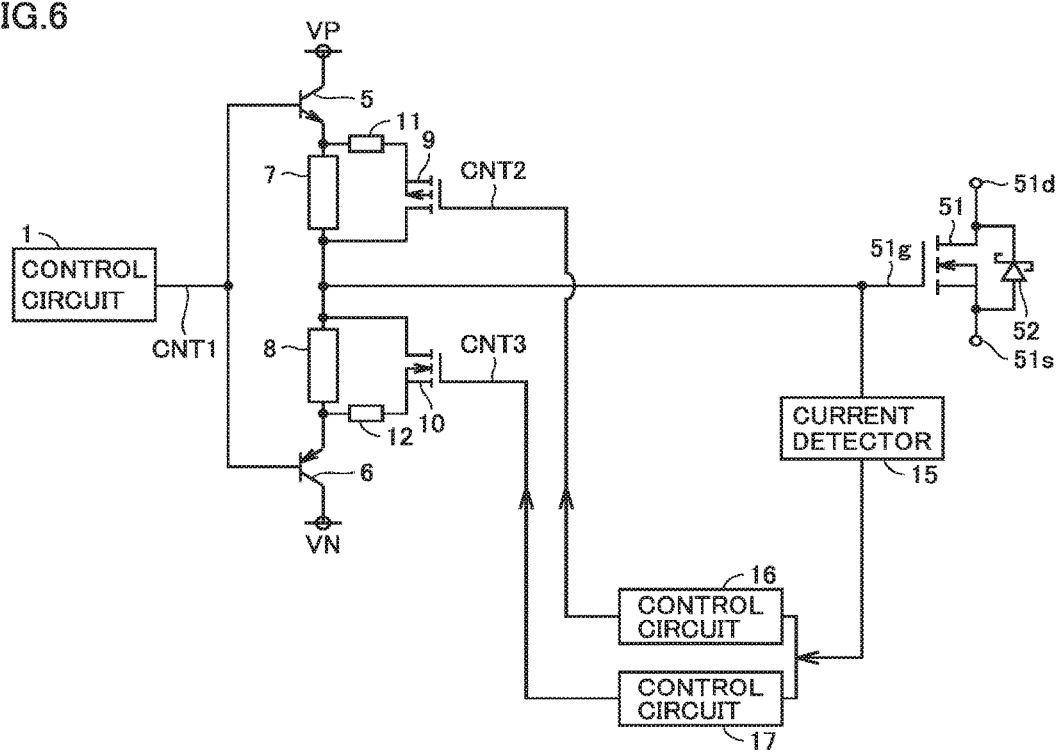
FIG. 6 shows a circuit block diagram showing a configuration of a drive circuit according to a second embodiment of this invention.

FIG. 6 shows a circuit block diagram showing a configuration of a drive circuit according to a second embodiment of this invention and compared with FIG. 1. Referring to FIG. 6, the drive circuit is different from the drive circuit in FIG. 1 in that a current detector 15 is added and control circuits 2 and 3 are replaced with control circuits 16 and 17, respectively.

Current detector 15 detects an instantaneous value of gate current Ig of power transistor 51 and outputs a signal indicating the detection value to control circuits 16 and 17. Current detector 15 detects gate current Ig, for example, by inserting a current sensor such as CT into a gate wiring. Control circuit 16 outputs control signal CNT2 based on a signal output from current detector 15. Control circuit 16 shifts control signal CNT2 from the "H" level to the "L" level at the timing of start of flow of a positive current to gate 51g of power transistor 51 and turns on P-channel MOS transistor 9. Thus, a current flows from the line of positive-electrode-side voltage VP through NPN transistor 5 and a parallel-connected assembly composed of on-gate resistor 7, resistor element 11, and P-channel MOS transistor 9 to gate 51g of power transistor 51 in order to increase the gate-source voltage of power transistor 51 from a negative bias voltage toward a positive bias voltage.

An amount of charges at the timing of appearance of the Miller period from turning on of power transistor 51 can be calculated from characteristics of power transistor 51 in advance. The amount of charges is calculated by integrating gate current Ig. Therefore, an amount of charges can be estimated by using gate current Ig and a time period for which gate current Ig flows when circuit parameters of the drive circuit is determined. Therefore, by shifting control signal CNT2 from the "L" level to the "H" level after lapse of a predetermined time period Tp since gate current Ig of power transistor 51 reached a predetermined positive value Ip, P-channel MOS transistor 9 can be turned off at the timing of start of the Miller period so that the switching speed of power transistor 51 can be lowered.

Control circuit 16 shifts control signal CNT2 from the "L" level to the "H" level after lapse of predetermined time period Tp since gate current Ig of power transistor 51 reached predetermined positive value Ip based on a signal output from current detector 15, and lowers the switching speed of power transistor 51. Predetermined time period Tp is set to a time period from the time point when gate current Ig reaches predetermined positive value Ip until start of the Miller period.

Control circuit 17 shifts control signal CNT3 from the "L" level to the "H" level at the timing of start of flow of a current from gate 51g of power transistor 51 to the line of negative-electrode-side voltage VN and turns on N-channel MOS transistor 10. Current Ig flows from gate 51g of power transistor 51 through a parallel-connected assembly composed of off-gate resistor 8, resistor element 12, and N-channel MOS transistor 10 and PNP transistor 6 to the line of negative-electrode-side voltage VN in order to fall gate-source voltage Vgs of power transistor 51.

An amount of charges withdrawn from gate 51g of power transistor 51 with falling in gate-source voltage Vgs of power transistor 51 can be known as characteristics of power transistor 51 in advance. The amount of charges is calculated by integrating gate current Ig. Therefore, an amount of charges can be estimated by using gate current Ig and a duration of flow of gate current Ig when circuit parameters of the drive circuit is determined. Therefore, by shifting control signal CNT3 from the "H" level to the "L" level after lapse of a predetermined time period Tn since gate current Ig of power transistor 51 reached a predetermined negative value In, N-channel MOS transistor 10 can be turned off at the timing of start of the Miller period so that the switching speed of power transistor 51 can be lowered.

Control circuit 17 shifts control signal CNT3 from the "H" level to the "L" level after lapse of predetermined time period Tn since gate current Ig of power transistor 51 reached predetermined negative value In based on a signal output from current detector 15, and lowers the switching speed of power transistor 51. Predetermined time period Tn is set to a time period from the time point when gate current Ig reaches predetermined negative value In until start of the Miller period.

The second embodiment can also provide a similar effect as described in the first embodiment. Though an example in which a current sensor such as CT is inserted in the gate wiring as means for detecting gate current 1g is shown, the similar effect is naturally obtained also, for example, with a method of detecting a voltage across a gate resistor.

Figure 7:
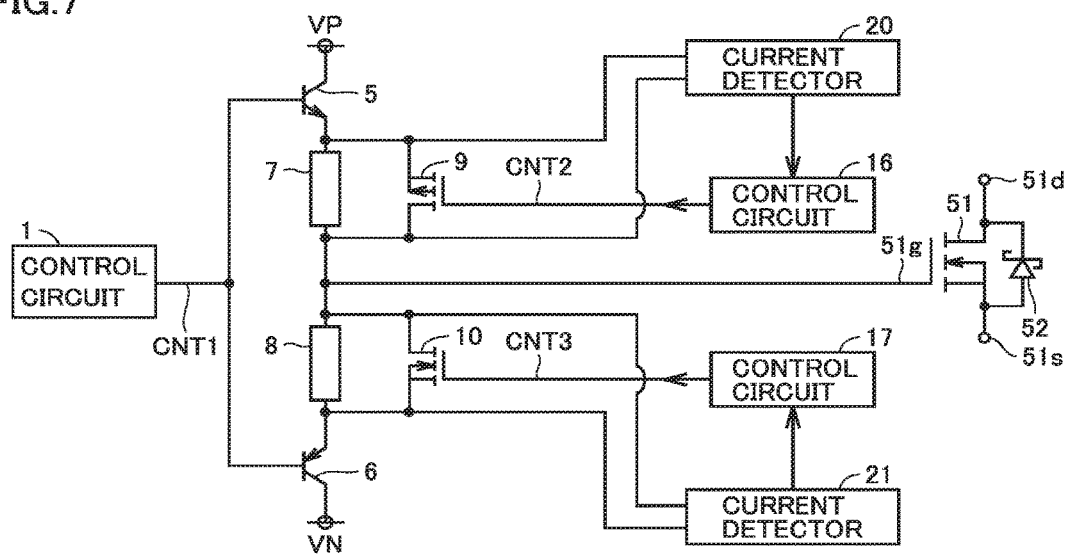
FIG. 7 shows a circuit block diagram showing a modification of the second embodiment.

FIG. 7 shows a circuit block diagram showing a modification of the second embodiment and compared with FIG. 6. Referring to FIG. 7, the modification is different from the drive circuit in FIG. 6 in that current detector 15 is replaced with current detectors 20 and 21. Current detector 20 detects a positive current which flows from the line of positive-electrode-side voltage VP to gate 51g of power transistor 51 based on a voltage across on-gate resistor 7 and outputs a signal indicating the detection value to control circuit 16. Control circuit 16 generates control signal CNT2 based on a signal output from current detector 20. Current detector 21 detects a negative current which flows from gate 51g of power transistor 51 to the line of negative-electrode-side voltage VN based on a voltage across off-gate resistor 8 and outputs a signal indicating the detection value to control circuit 17. Control circuit 17 generates control signal CNT3 based on a signal output from current detector 21. This modification can provide a similar effect as described in the second embodiment, and in addition, a positive current and a negative current which flow to and from gate 51g of power transistor 51 can be detected readily and accurately.

Third Embodiment

Figure 8:
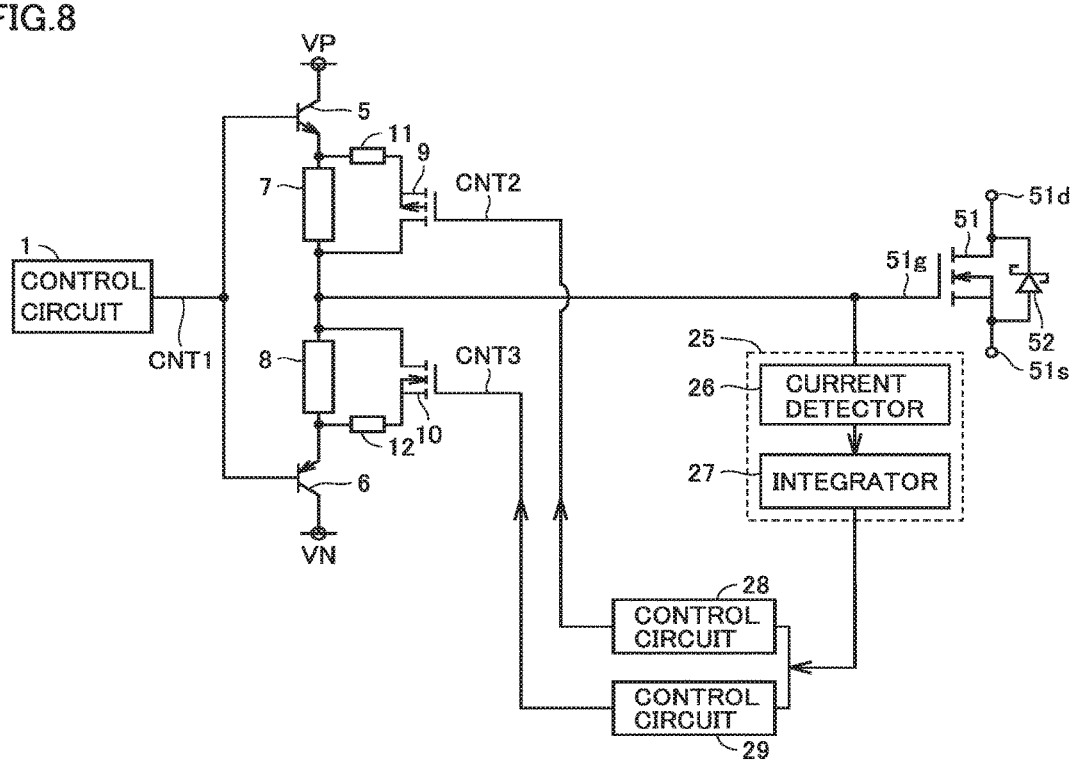
FIG. 8 shows a circuit block diagram showing a configuration of a drive circuit according to a third embodiment of this invention.

FIG. 8 shows a circuit block diagram showing a configuration of a drive circuit according to a third embodiment of this invention and compared with FIG. 6. Referring to FIG. 8, the drive circuit is different from the drive circuit in FIG. 6 in that current detector 15 is replaced with a charge detector 25 and control circuits 16 and 17 are replaced with control circuits 28 and 29, respectively.

Charge detector 25 includes a current detector 26 and an integrator 27. Current detector 26 detects an instantaneous value of gate current Ig of power transistor 51 and outputs a signal indicating the detection value to integrator 27. Integrator 27 integrates gate current Ig of power transistor 51 detected by current detector 26 and outputs a signal indicating the integration value to control circuits 28 and 29. The signal output from integrator 27 indicates an amount of charges accumulated in the gate capacitance of power transistor 51 and it serves as a signal output from charge detector 25.

Control circuit 28 outputs control signal CNT2 based on the signal output from integrator 27. Control circuit 28 shifts control signal CNT2 from the "H" level to the "L" level at the timing of start of increase in amount of charges at gate 51g of power transistor 51 and turns on P-channel MOS transistor 9. Thus, a current flows from the line of positive-electrode-side voltage VP through NPN transistor 5 and a parallel-connected assembly composed of on-gate resistor 7, resistor element 11, and P-channel MOS transistor 9 to gate 51g of power transistor 51 in order to increase the gate-source voltage of power transistor 51 from a negative bias voltage toward a positive bias voltage.

Figure 9:
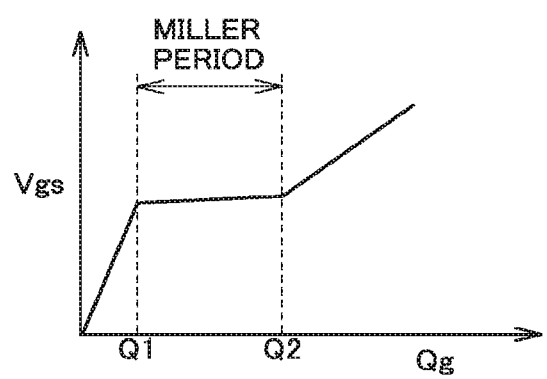
FIG. 9 shows a diagram showing relation between an amount of gate charges and a gate-source voltage of the power transistor shown in FIG. 8.

FIG. 9 shows a diagram showing relation between an amount of charges Qg at gate 51g of power transistor 51 and gate-source voltage Vgs. A turn-on operation will be described by way of example. In FIG. 9, the gate-source voltage increases with application of a positive bias voltage between the gate and the source of power transistor 51 and charges are accumulated in a gate-source capacitance. When the first Miller period appears, the gate-source voltage is substantially constant. During this period, charges are accumulated mainly in a drain-gate capacitance. Thereafter, the gate-source voltage again increases and the amount of accumulated charges increases. Since amount of charges Qg and the Miller period thus correlate with each other as shown in FIG. 9, a value Q1 for amount of charges Qg when the first Miller period appears can be known in advance.

Control circuit 28 shifts control signal CNT2 from the "L" level to the "H" level in response to amount of charges Qg at gate 51g of power transistor 51 attaining to predetermined value Q1 (that is, in response to start of the first Miller period) based on a signal output from charge detector 25, and lowers the switching speed of power transistor 51. Predetermined value Q1 is set to gate charge amount Qg to be detected at the time when the first Miller period starts.

Control circuit 29 outputs control signal CNT3 based on a signal output from charge amount detector 25. Control circuit 29 shifts control signal CNT3 from the "L" level to the "H" level at the timing of start of decrease in amount of charges at gate 51g of power transistor 51 and turns on N-channel MOS transistor 10. Thus, current Ig flows from gate 51g of power transistor 51 through a parallel-connected assembly composed of off-gate resistor 8, resistor element 12, and N-channel MOS transistor 10 and PNP transistor 6 to the line of negative-electrode-side voltage VN in order to fall gate-source voltage Vgs of power transistor 51.

The gate-source voltage falls as a result of application of a negative bias voltage between the gate and the source of power transistor 51 and charges are withdrawn. When the second Miller period appears, the gate-source voltage is substantially constant. During this period, charges are withdrawn mainly from the drain-gate capacitance. Thereafter, the gate-source voltage again falls and an amount of accumulated charges decreases. Since amount of charges Qg and the Miller period thus correlate with each other as shown in FIG. 9, a value Q2 for amount of charges Qg at the time when the second Miller period appears can be known in advance.

Control circuit 29 shifts control signal CNT3 from the "H" level to the "L" level in response to amount of charges Qg at gate 51g of power transistor 51 attaining to predetermined value Q2 (that is, in response to appearance of the second Miller period) based on a signal output from charge detector 25, and lowers the switching speed of power transistor 51.

The third embodiment can also provide a similar effect as described in the first embodiment. In addition, since integrator 27 is provided, the drive circuit can be controlled more accurately than in the second embodiment.

Fourth Embodiment

Figure 10:
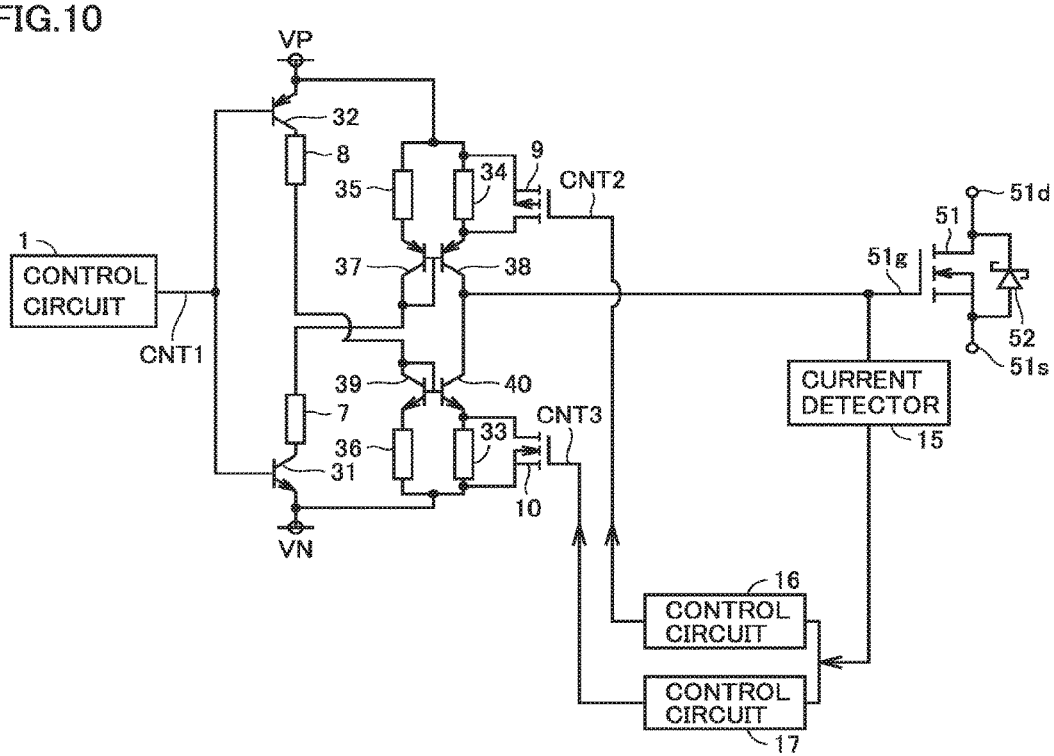
FIG. 10 shows a circuit block diagram showing a configuration of a drive circuit according to a fourth embodiment of this invention.

FIG. 10 shows a circuit block diagram showing a configuration of a drive circuit according to a fourth embodiment of this invention and compared with FIG. 6. Referring to FIG. 10, the drive circuit is different from the drive circuit in FIG. 6 in that NPN transistor 5 and PNP transistor 6 are replaced with a PNP transistor 32, an NPN transistor 31, resistor elements 33 to 36, PNP bipolar transistors 37 and 38, and NPN bipolar transistors 39 and 40.

Resistor element 35, PNP bipolar transistor 37, on-gate resistor 7, and NPN transistor 31 are connected in series between the line of positive-electrode-side voltage VP and the line of negative-electrode-side voltage VN, and resistor element 34 and PNP bipolar transistor 38 are connected in series between the line of positive-electrode-side voltage VP and gate 51g of power transistor 51. Bases of PNP bipolar transistors 37 and 38 are both connected to the collector of PNP bipolar transistor 37 to thereby implement a current mirror circuit.

NPN transistor 31 is turned on while control signal CNT1 is at the "H" level and turned off while control signal CNT1 is at the "L" level. When NPN transistor 31 is turned on, a current flows from the line of positive-electrode-side voltage VP through resistor element 35, PNP bipolar transistor 37, on-gate resistor 7, and NPN transistor 31 to the line of negative-electrode-side voltage VN. When a current flows to PNP bipolar transistor 37, a current having a value in accordance with that current flows also to PNP bipolar transistor 38. Therefore, when NPN transistor 31 is turned on, a positive constant current flows from the line of positive-electrode-side voltage VP through resistor element 34 and PNP bipolar transistor 38 to gate 51g of power transistor 51 so that power transistor 51 is turned on.

PNP transistor 32, off-gate resistor 8, NPN bipolar transistor 39, and resistor element 36 are connected in series between the line of positive-electrode-side voltage VP and the line of negative-electrode-side voltage VN, and NPN transistor 40 and resistor element 33 are connected in series between gate 51g of power transistor 51 and the line of negative-electrode-side voltage VN. Bases of NPN transistors 39 and 40 are both connected to the collector of NPN transistor 39 to thereby implement a current mirror circuit.

PNP transistor 32 is turned on while control signal CNT1 is at the "L" level and turned off while control signal CNT1 is at the "H" level. When PNP transistor 32 is turned on, a current flows from the line of positive-electrode-side voltage VP through PNP transistor 32, off-gate resistor 8, NPN bipolar transistor 39, and resistor element 36 to the line of negative-electrode-side voltage VN. When a current flows to NPN bipolar transistor 39, a current having a value in accordance with that current flows also to NPN bipolar transistor 40. Therefore, when PNP transistor 32 is turned on, a constant current flows from gate Mg of power transistor 51 through NPN bipolar transistor 40 and resistor element 33 to the line of negative-electrode-side voltage VN so that power transistor 51 is turned off.

Operations by this drive circuit will now be described. When control signal CNT1 shifts from the "L" level to the "H" level, PNP transistor 32 is turned off and NPN transistor 31 is turned on. Control circuit 16 outputs control signal CNT2 based on a signal output from current detector 15. Control circuit 16 shifts control signal CNT2 from the "H" level to the "L" level at the timing when a positive current starts to flow to gate 51g of power transistor 51 and turns on P-channel MOS transistor 9. Thus, a current flows from the line of positive-electrode-side voltage VP through resistor element 35, PNP bipolar transistor 37, on-gate resistor 7, and NPN transistor 31 to the line of negative-electrode-side voltage VN, and current Ig flows from the line of positive-electrode-side voltage VP through a parallel-connected assembly composed of resistor element 34 and P-channel MOS transistor 9 and PNP bipolar transistor 38 to gate 51g of power transistor 51. With the function of control circuit 16, P-channel MOS transistor 9 is turned off after lapse of predetermined time period Tp since gate current Ig attained to predetermined positive value Ip so that the switching speed of power transistor 51 is suppressed.

When control signal CNT1 shifts from the "H" level to the "L" level, PNP transistor 32 is turned on and NPN transistor 31 is turned off. Control circuit 17 shifts control signal CNT3 from the "L" level to the "H" level at the timing of start of flow of the current from gate 51g of power transistor 51 to the line of negative-electrode-side voltage VN, and turns on N-channel MOS transistor 10. Thus, a current flows from the line of positive-electrode-side voltage VP through PNP transistor 32, off-gate resistor 8, NPN bipolar transistor 39, and resistor element 36 to the line of negative-electrode-side voltage VN, and current 1g flows from gate 51g of power transistor 51 through NPN bipolar transistor 40 and a parallel-connected assembly composed of resistor element 33 and N-channel MOS transistor 10 to the line of negative-electrode-side voltage VN. With the function of control circuit 17, N-channel MOS transistor 10 is turned off after lapse of predetermined time period Tn since gate current Ig attained to predetermined negative value In so that the switching speed of power transistor 51 is suppressed.

The fourth embodiment can also provide a similar effect as described in the second embodiment.

Fifth Embodiment

Figure 11:
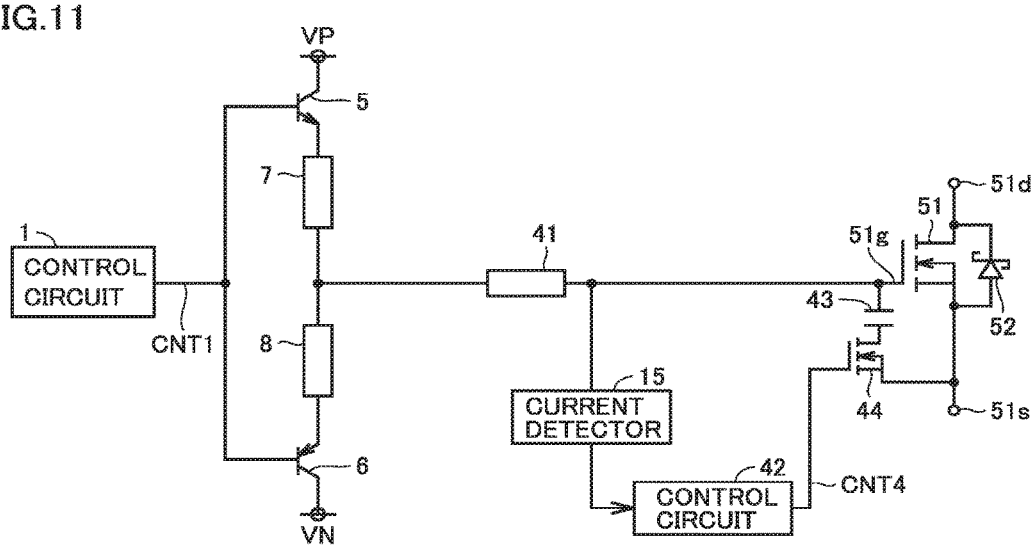
FIG. 11 shows a circuit block diagram showing a configuration of a drive circuit according to a fifth embodiment of this invention.

FIG. 11 shows a circuit block diagram showing a configuration of a drive circuit according to a fifth embodiment of this invention and compared with FIG. 6. Referring to FIG. 11, the drive circuit is different from the drive circuit in FIG. 6 in that transistors 9 and 10, resistor elements 11 and 12, and control circuits 16 and 17 are removed and a resistor element 41, a control circuit 42, a capacitor 43, and an N-channel MOS transistor 44 are added.

Resistor element 41 is connected between a node of on-gate resistor 7 and off-gate resistor 8 and gate 51g of power transistor 51. Current detector 15 detects gate current Ig of power transistor 51 and outputs a signal indicating the detection value to control circuit 42. Capacitor 43 and N-channel MOS transistor 44 are connected in series between gate 51g and source 51s of power transistor 51. The gate of N-channel MOS transistor 44 receives a control signal CNT4 from control circuit 42.

Control circuit 42 generates control signal CNT4 based on a signal output from current detector 15. Control signal CNT4 is set to the "H" level after lapse of predetermined time period Tp since gate current Ig of power transistor 51 reached predetermined positive value Ip. Control signal CNT4 is set to the "L" level when a current which flows to gate 51g of power transistor 51 becomes lower than predetermined positive value Ip. Control signal CNT4 is set to the "L" level after lapse of predetermined time period Tn since gate current Ig of power transistor 51 reached predetermined negative value In. Control signal CNT4 is set to the "H" level when a current which flows to gate 51g of power transistor 51 becomes higher than predetermined negative value In.

Operations by this drive circuit will now be described. When control signal CNT1 rises from the "L" level to the "H" level, NPN transistor 5 is turned on and PNP transistor 6 is turned off. Thus, a positive bias voltage is applied between the gate and the source of power transistor 51 from the line of positive-electrode-side voltage VP through NPN transistor 5, on-gate resistor 7, and resistor element 41.

When gate current Ig which flows into gate 51g of power transistor 51 reaches predetermined positive value Ip, control signal CNT4 rises from the "L" level to the "H" level after lapse of predetermined time period Tp (that is, when the first Miller period appears), and N-channel MOS transistor 44 is turned on. Capacitor 43 is thus connected between gate 51g and source 51s of power transistor 51 and a rate of increase in gate-source voltage Vgs is suppressed so that the switching speed of power transistor 51 is suppressed.

When control signal CNT1 shifts from the "H" level to the "L" level, NPN transistor 5 is turned off and PNP transistor 6 is turned on. Thus, a negative bias voltage is applied between the gate and the source of power transistor 51 from the line of negative-electrode-side voltage VN through PNP transistor 6, off-gate resistor 8, and resistor element 41.

When gate current Ig which flows out of gate 51g of power transistor 51 reaches predetermined negative value In, control signal CNT4 shifts from the "H" level to the "L" level after lapse of predetermined time period Tn (that is, when the second Miller period appears), and N-channel MOS transistor 44 is turned off. Thus, capacitor 43 between gate 51g and source 51s of power transistor 51 is disconnected and a rate of falling in gate-source voltage Vgs is suppressed so that the switching speed of power transistor 51 is suppressed.

The fifth embodiment can also provide a similar effect as described in the second embodiment.

Control signal CNT1 can be provided to control circuit 42. Control circuit 42 can shift control signal CNT4 from the "L" level to the "H" level in response to a turn-on command in control signal CNT1, and can shift control signal CNT4 from the "H" level to the "L" level in response to a turn-off command.

Sixth Embodiment

Figure 12:
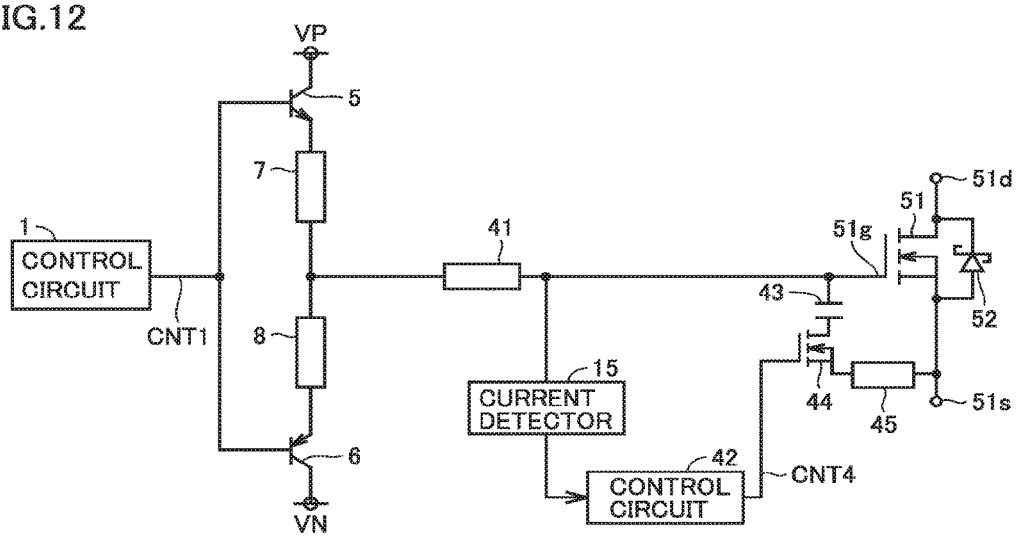
FIG. 12 shows a circuit block diagram showing a configuration of a drive circuit according to a sixth embodiment of this invention.

FIG. 12 shows a circuit block diagram showing a configuration of a drive circuit according to a sixth embodiment of this invention and compared with FIG. 11. Referring to FIG. 12, the drive circuit is different from the drive circuit in FIG. 11 in that a resistor element 45 is added. Resistor element 45 is connected between N-channel MOS transistor 44 and source 51s of power transistor 51.

When gate current Ig which flows into gate 51g of power transistor 51 reaches predetermined positive value Ip by control circuit 42, control signal CNT4 shifts from the "L" level to the "H" level after lapse of predetermined time period Tp (that is, when the first Miller period appears), and N-channel MOS transistor 44 is turned on. Thus, capacitor 43 and resistor element 45 are connected between gate 51g and source 51s of power transistor 51, and hence a rate of increase in gate-source voltage Vgs is suppressed and consequently the switching speed of power transistor 51 is suppressed. An insertion of resistor element 45 facilitates adjustment of a time constant so that the switching speed can be suppressed with ease.

When gate current Ig which flows out of gate 51g of power transistor 51 reaches predetermined negative value In by control circuit 42, control signal CNT4 shifts from the "H" level to the "L" level after lapse of predetermined time period Tn (that is, when the second Miller period appears), and N-channel MOS transistor 44 is turned off. Since capacitor 43 between gate 51g and source 51s of power transistor 51 is thus disconnected, a rate of falling in gate-source voltage Vgs is suppressed and consequently the switching speed of power transistor 51 is suppressed. An insertion of resistor element 45 facilitates adjustment of a time constant for suppressing the switching speed.

It is needless to say that the first to sixth embodiments and the plurality of modifications above can be combined appropriately.

A power module can be implemented to mount the drive circuit and power transistor 51 shown in any one of the first to sixth embodiments in a single package. A power converter including a plurality of sets of a drive circuit, power transistor 51, and diode 52 can be mounted on a single package to implement a power module.

When a wide band-gap semiconductor which has wider energy-band-gap than silicon is employed for power transistor 51, a higher switching operation in speed than in an example in which silicon is employed can be performed. Therefore, conductive and/or radiative noise generated during the switching operation may be further higher. Therefore, the first to sixth embodiments described above are suitable when a wide band-gap semiconductor is employed for power transistor 51. Any one of silicon carbide, gallium nitride, gallium oxide, and diamond is employed as the wide band-gap semiconductor.

It should be understood that the embodiments disclosed herein are illustrative and non-restrictive in every respect. The scope of the present invention is defined by the terms of the claims rather than the description above, and is intended to include any modifications within the scope and meaning equivalent to the terms of the claims.

REFERENCE SIGNS LIST

1 to 3, 16, 17, 28, 29, 42 control circuit; 5 NPN transistor; 6 PNP transistor; 31, 32 switch; 7 on-gate resistor; 8 off-gate resistor; 11, 12, 33 to 36, 41, 45 resistor element; 9 P-channel MOS transistor; 10, 44 N-channel MOS transistor; 15, 20, 21, 26 current detector; 25 charge detector; 27 integrator; 37, 38 PNP bipolar transistor; 39, 40 NPN bipolar transistor; 43 capacitor; 51 power transistor; and 52 diode

The invention claimed is:

1. A drive circuit configured to drive a power transistor in response to a control signal, the drive circuit comprising:
   a current detector configured to detect a gate current of the power transistor; and
   a control circuit configured to operate based on a result of detection by the current detector and to lower gate driving capability of the drive circuit in response to lapse of a time period from a time point when the gate current reaches a first predetermined current value until appearance of a first Miller period.

2. The drive circuit according to claim 1, wherein
   the control circuit is configured to lower the gate driving capability of the drive circuit in response to lapse of a time period from a time point when the gate current reaches a second predetermined current value until appearance of a second Miller period.

3. The drive circuit according to claim 2, wherein
   the current detector is configured to detect the gate current based on a voltage across terminals of a resistor element located in a current path through which the gate current flows.

4. The drive circuit according to claim 3, wherein
   the control circuit is configured to determine the time period from the time point when the gate current reaches the first predetermined current value until appearance of the first Miller period in response to an event in which an amount of charges accumulated at a gate of the power transistor that is obtained by integrating an output signal of the current detector reaches an amount of gate charges to be detected when the first Miller period appears.

5. The drive circuit according to claim 2, wherein
   the control circuit is configured to determine the time period from the time point when the gate current reaches the first predetermined current value until appearance of the first Miller period in response to an event in which an amount of charges accumulated at a gate of the power transistor that is obtained by integrating an output signal of the current detector reaches an amount of gate charges to be detected when the first Miller period appears.

6. The drive circuit according to claim 2, wherein
   the control circuit is further configured to determine the time period from the time point when the gate current reaches the second predetermined current value until appearance of the second Miller period in response to an event in which an amount of charges accumulated at a gate of the power transistor that is obtained by integrating an output signal of the current detector reaches an amount of gate charges to be detected when the second Miller period appears, lower the gate driving capability of the drive circuit in response to an amount of charges accumulated in the power transistor in response to a turn-off command in the control signal reaching an amount of gate charges to be detected when a second Miller period appears.

7. The drive circuit according to claim 1, wherein
   the current detector is configured to detect the gate current based on a voltage across terminals of a resistor element located in a current path through which the gate current flows.

8. The drive circuit according to claim 7, wherein
   the control circuit is configured to determine the time period from the time point when the gate current reaches the first predetermined current value until appearance of the first Miller period in response to an event in which an amount of charges accumulated at a gate of the power transistor that is obtained by integrating an output signal of the current detector reaches an amount of gate charges to be detected when the first Miller period appears.

9. The drive circuit according to claim 1, wherein
   the control circuit is configured to determine the time period from the time point when the gate current reaches the first predetermined current value until appearance of the first Miller period in response to an event in which an amount of charges accumulated at a gate of the power transistor that is obtained by integrating an output signal of the current detector reaches an amount of gate charges to be detected when the first period appears.

10. The drive circuit according to claim 1, further comprising:
- an on-gate resistor connected between a positive-electrode-side voltage and a gate of the power transistor, the positive-electrode-side voltage applying a positive bias voltage to the gate;
- an off-gate resistor connected between a negative-electrode-side voltage and the gate, the negative-electrode-side voltage applying a negative bias voltage to the gate; and
- a semiconductor switch connected in parallel to at least one of the on-gate resistor and the off-gate resistor.

11. The drive circuit according to claim 1, the power transistor including a gate, a first electrode, and a second electrode, and the drive circuit further comprising a capacitor and a switch connected in series between the gate and the first electrode.

12. The drive circuit according to claim 1, the power transistor including a gate, a first electrode, and a second electrode, and the drive circuit further comprising a capacitor, a switch, and a resistor connected in series between the gate and the first electrode.

13. A power module comprising:
- the drive circuit according to claim 1; and
- the power transistor.

14. The power module according to claim 13, wherein
- the power transistor is composed of a wide band-gap semiconductor wider in energy-band-gap than silicon.

15. The power module according to claim 14, wherein
- the wide band-gap semiconductor is any one of silicon carbide, gallium nitride, gallium oxide, and diamond.

* * * * *

UNITED STATES PATENT AND TRADEMARK OFFICE
CERTIFICATE OF CORRECTION

PATENT NO. : 10,476,496 B2
APPLICATION NO. : 16/098485
DATED : November 12, 2019
INVENTOR(S) : Takeshi Horiguchi It is certified that error appears in the above-identified patent and that said Letters Patent is hereby corrected as shown below:

In the Claims

Column 14, Line 37, please change "Miller period appears, lower" to --Miller period appears, and lower--.

Signed and Sealed this
Seventh Day of April, 2020

Andrei Iancu
*Director of the United States Patent and Trademark Office*